United States Patent
Dixon et al.

(10) Patent No.: US 6,608,479 B1
(45) Date of Patent: Aug. 19, 2003

(54) METHOD AND SYSTEM FOR MRI WITH LIPID SUPPRESSION

(75) Inventors: William Thomas Dixon, Clifton Park, NY (US); Christopher Judson Hardy, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/063,805

(22) Filed: May 15, 2002

(51) Int. Cl.$^7$ .................................................. G01V 3/00
(52) U.S. Cl. ........................................ 324/307; 324/314
(58) Field of Search .............................. 324/307, 309, 324/300, 314, 312, 318, 322

(56) References Cited

U.S. PATENT DOCUMENTS

| | | | |
|---|---|---|---|
| 5,270,652 A | 12/1993 | Dixon et al. ............... | 324/309 |
| 5,557,202 A | * 9/1996 | Miyazaki et al. ........... | 324/307 |
| 6,016,057 A | 1/2000 | Ma ............................ | 324/309 |
| 6,307,368 B1 | 10/2001 | Vasanawala et al. ........ | 324/309 |
| 6,339,332 B1 | * 1/2002 | Deimling .................... | 324/309 |

OTHER PUBLICATIONS

ME Stromski, HR Brady, SR Gullans and S. Patz, "Application of Missing Pulse Steady State Free Precession To The Study Of Renal Microcirculation," Magnetic Resonance in Medicine 20, pp. 66–77, (1991).

S. Patz, STS Wong, and MS Roos, "Missing Pulse Steady–State Free Precession," Magnetic Resonance in Medicine 10, pp. 194–209, (1989).

* cited by examiner

*Primary Examiner*—Louis Arana
(74) *Attorney, Agent, or Firm*—Jean K. Testa; Patrick K. Patnode

(57) ABSTRACT

A method and system are provided for acquiring images with water and lipid separation using a magnetic resonance imaging (MRI) system comprising applying a plurality of steady-state free precession (SSFP) radio-frequency (RF) excitation pulses to discriminate lipids from water, the pulses having respective inter-pulse gaps between the pulses, the inter-pulse gaps varying among different widths.

13 Claims, 2 Drawing Sheets

METHOD AND SYSTEM FOR MRI WITH LIPID SUPPRESSION

BACKGROUND OF THE INVENTION

The present invention relates generally to magnetic resonance imaging (MRI), and more particularly to a system and method for water and fat separation in MRI pulse sequences employing steady-state free precession.

MRI pulse sequences that take advantage of steady-state free precession (SSFP), e.g. Siemens' "True-FISP", General Electric's "FIESTA", and Phillip's "Balanced FFE", allow fast imaging without excessive saturation of signals. In practice, SSFP is extremely useful for rapid imaging with relatively high signal-to-noise ratio of fluids such as blood. However, these sequences tend to produce bright fat signals which are in many cases undesirable, especially for instance when imaging the coronary arteries.

Various methods have been used to discriminate fat from water during SSFP imaging. Fluctuating equilibrium sequences, which adjust pulse phases in multiple images, can separate fat and water. Fat saturation has also been accomplished in SSFP with proper spin-preparation during periodic interruption with fat-saturation pulses. Interleaving fat-saturation pulses into the pulse sequence can disturb the steady-state equilibrium and affect water signals undesirably and, since not all parts of k-space are equally affected, can spread remaining fat signal to fat-free regions of the image. A method is needed for suppressing fat signals in steady-state free precession pulse sequences without the use of separate fat-saturation pulses.

SUMMARY OF INVENTION

In a first aspect, a method is provided for acquiring images with water and lipid separation using a magnetic resonance imaging (MRI) system. This method comprises applying a plurality of steady-state free precession (SSFP) radio-frequency (RF) excitation pulses having respective inter-pulse gaps between the pulses to discriminate lipids from water wherein the inter-pulse gaps alternate between a first width and a second width.

In a second aspect, a system for Magnetic Resonance Imaging (MRI) for acquiring images of an object is provided. The system comprises a magnetic field driver for driving a field gradient, a magnetic field controller for controlling the magnetic field, a transmitter for generating an radio frequency (RF) pulse to cause resonance and wherein the transmitter is adapted to generate a plurality of steady-state free precession (SSFP) radio-frequency excitation pulses having respective inter-pulse gaps between the pulses to discriminate lipids from water, the inter-pulse gaps alternating between a first width and a second width. The system further comprises a receiver for receiving and detecting magnetic resonance signals generated from the object and a processor for performing image reconstruction and for generating images for display.

BRIEF DESCRIPTION OF DRAWINGS

The features and advantages of the present invention will become apparent from the following detailed description of the invention when read with the accompanying drawings in which.

DETAILED DESCRIPTION

Figure 1:
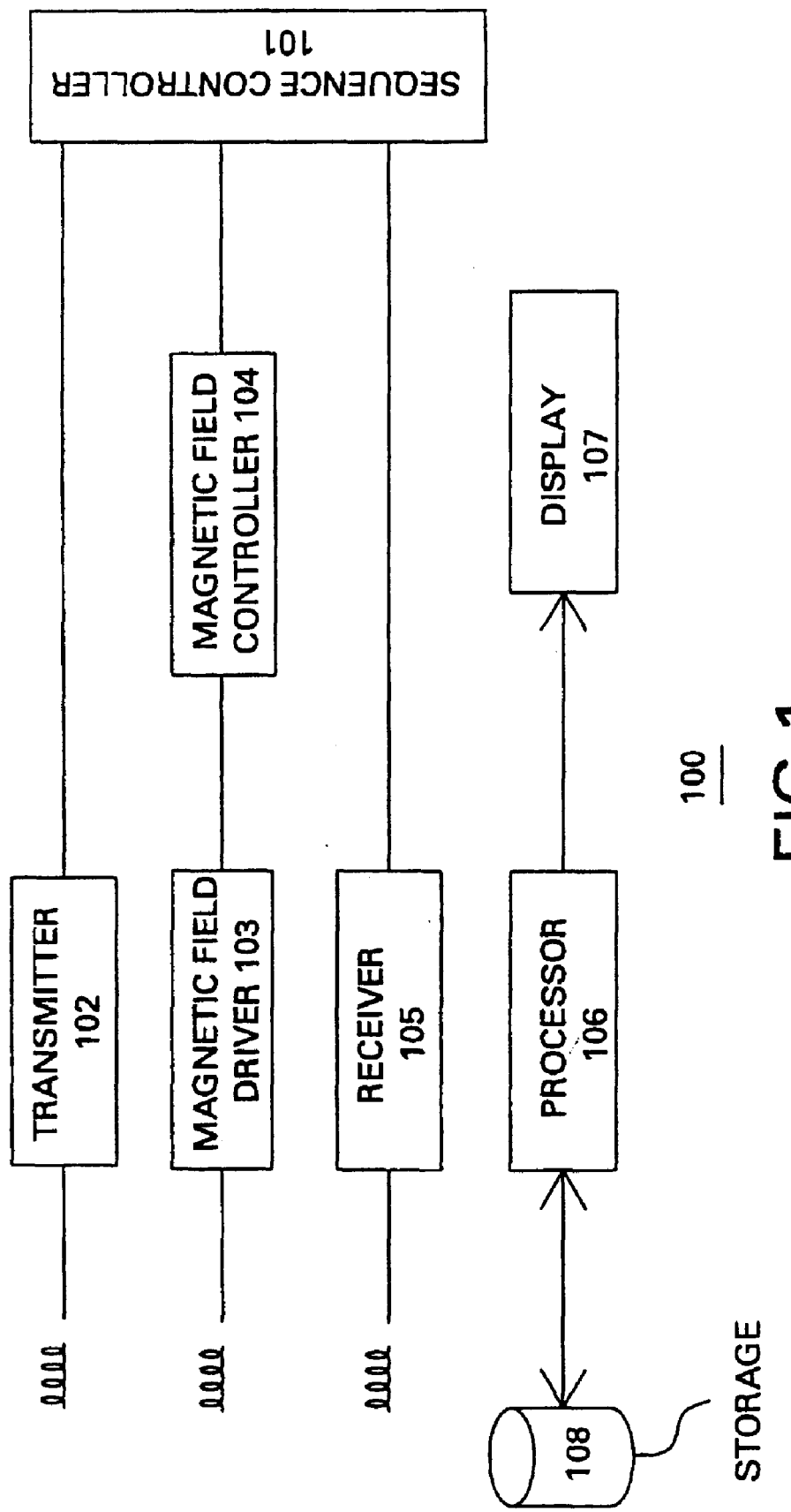
FIG. 1 is a block diagram of a Magnetic Resonance Imaging (MRI) system to which embodiments of the present invention are applicable.

Referring to FIG. 1, there is shown a block diagram of a magnetic resonance imaging (MRI) system for which embodiments of the present invention are applicable. The MRI system 100 comprises a sequence controller 101 for controlling various components of the system, as is well-known, for detecting magnetic resonance signals from the part of an object being imaged; a transmitter 102 for generating an radio frequency (RF) pulse to cause resonance; a magnetic field driver 103 for driving a field gradient in a known manner; a magnetic field controller 104 for controlling the magnetic field; a receiver 105 for receiving and detecting magnetic resonance signals generated from the object; a processor 106 for performing image reconstruction and various calculations for system operation; a display 107 for displaying images; and a peripheral memory device 108 for storing detected signal data and reconstructed k-space data.

In a well-known manner, processor 106 is configured such that there is sufficient memory for storing measured data and reconstructed images. The memory is sufficient to store the whole of N-dimensional measured data as well as reconstructed data. Also in a well-known manner, a MR image is constructed from the image or k-space data corresponding to a predetermined plurality of applications of a MRI pulse sequence initiated by a RF pulse such as from transmitter 102 of FIG. 1. The image is updated by collecting image or k-space data from repetitive MRI pulse sequences. An MR image is reconstructed by performing a series of Fourier transforms along a set of orthogonal directions in k-space. As used herein, "adapted to", "configured" and the like refer to operation capabilities of electrical elements such as analog or digital computers or application specific devices (such as an application specific integrated circuit (ASIC)) that are programmed to perform a sequel to provide an output in response to given input signals.

As a general description, magnetic resonance imaging (MRI) is a well-known imaging method in which magnetic moments are excited at specific nuclear spin precession frequencies that are proportional to the magnetic field occurring within the magnet of the MRI system. Spin is a fundamental property of nature, such as electrical charge or mass. Precession is a rotational motion about an axis of a vector whose origin is fixed at the origin. The radio-frequency (RF) signals resulting from the precession of these spins are received typically using RF coils in the MRI system and are used to generate images of a volume of interest. A pulse sequence is a selected series of RF pulses and/or magnetic field gradients applied to a spin system to produce a signal representative of some property of the spin system. Described herein are embodiments employing steady-state free precession (SSFP) pulse sequences adapted to discriminate lipids from water. SSFP pulse sequences are generally used for fast imaging without excessive saturation of signals. SSFP pulse sequences are particularly useful for cardiac and cerebral spinal fluid (CSF) imaging applications. MRI pulse sequences that take advantage of steady-state free precession (SSFP), e.g. Siemens' "True-FISP", General Electric's "FIESTA", and Phillip's "Balanced FFE", can rapidly create images characterized by T2*/T1 contrast. The time constant that describes the return to equilibrium of the transverse magnetization, $M_{XY}$, is called the spin-spin relaxation time, T2. T1 governs the rate of recovery of the longitudinal magnetization. T2* is the spin-spin relaxation time composed of contributions from molecular interactions and inhomogeneities in the magnetic field.

In Bloch simulations of SSFP, it has been shown that a variation of steady-state transverse magnetization occurs with chemical shift. Transverse magnetization refers to the XY component of the net magnetization. Chemical shift refers generally to a variation in the resonance frequency of a nuclear spin due to the chemical environment around the nucleus. Chemical shift is typically reported in parts per million (ppm) or Hz.

Figure 2:
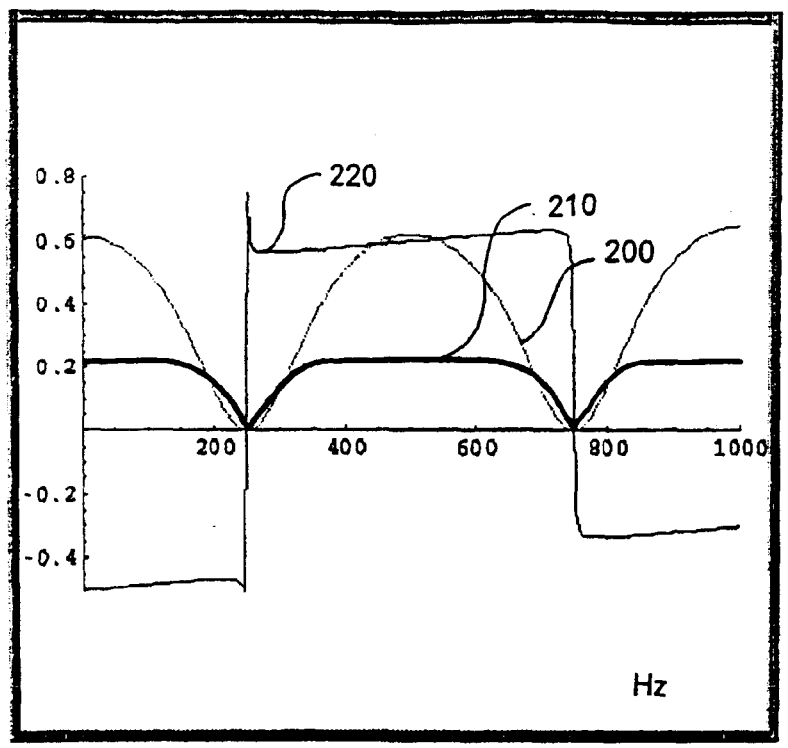
FIG. 2 is a graphical illustration of chemical-shift behavior for a FIESTA steady-state free precession (SSFP) pulse sequence; and, FIG. 3 is a graphical illustration of magnetization and phase for the FIESTA pulse sequence of FIG. 2 alternating between a first and second repetition time to which embodiments of the present invention are applicable.

The chemical-shift behavior of the FIESTA pulse sequence is shown in FIG. 2. Referring to FIG. 2, exemplary embodiments of longitudinal 200 and transverse 210 magnetization are shown, with phase normalized to $2\pi$ (220), as a function of resonance offset, in Hz, for a FIESTA pulse sequence with TR=2 ms, tip angle 40°, T1=1000 ms, T2=200 ms. The phase of the RF pulse alternates between 0 and $\pi$ in this exemplary embodiment shown in FIG. 2.

Because the magnetization steady state depends sensitively on the phase of the magnetization when each RF pulse is applied, both the longitudinal 200 and transverse 210 magnetization exhibit repeated dips as a function of chemical shift. These dips are periodic at the inverse of the repetition time TR. Tuning of the repetition time can therefore in principle be used to position the first null over the fat resonance (at around 250 Hz at 1.5 T), and thus attenuate the fat signal. However, in practice this null region is much too narrow to be useful for this purpose. For embodiments of the present invention, the terms "fat" and "lipid" used herein are to be used interchangeably and refer to matter that exhibit similar chemical shift behavior, and can refer to fat tissue and artificial tissue, such as silicone implants and the like.

It is possible to broaden the null region, however, while maintaining a relatively broad plateau around the water resonance at 0 Hz, by alternating between (e.g. two) different repetition times TR. In a first embodiment of the present invention, a method for acquiring images with water and lipid separation using a magnetic resonance imaging (MRI) system is provided comprising the step of applying a plurality of steady-state free precession (SSFP) radio-frequency (RF) excitation pulses having respective inter-pulse gaps between the pulses to discriminate lipids from water, wherein the inter-pulse gaps alternate between a first width and a second width. The pulses are applied repeatedly during imaging to produce respective images corresponding to lipids and water. In this embodiment, it is possible to broaden the null region while maintaining a relatively broad plateau around the water resonance at 0 Hz. Further, the pulses are substantially constant in amplitude. Furthermore, it is to be appreciated that a separate fat saturation pulse is not necessary in this embodiment.

Figure 3:
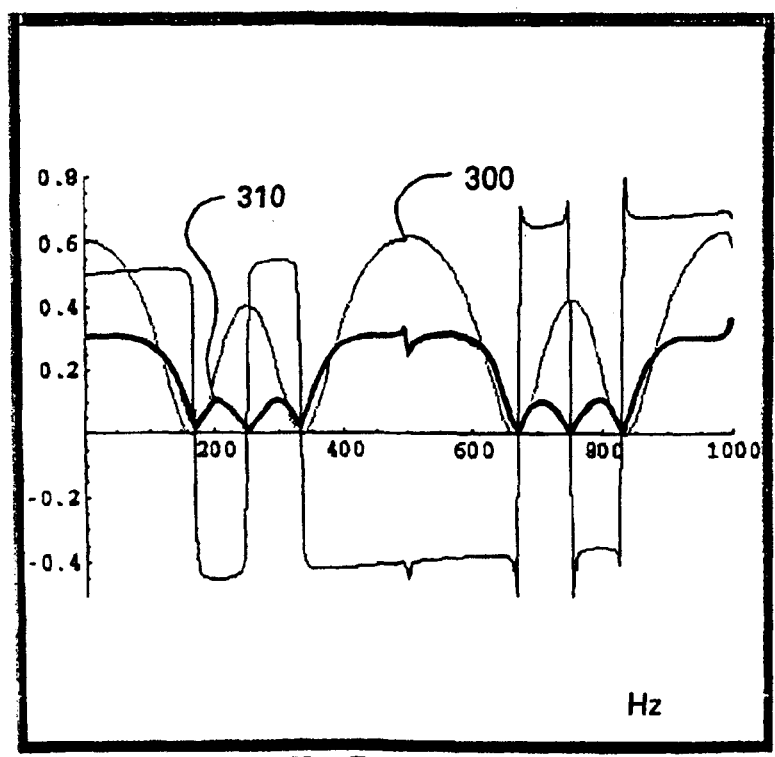

This first embodiment is illustrated in FIG. 3, for the case where the two TRs are 2 ms (first repetition time) and 4 ms (second repetition time), for an MRI scanner with 1.5 Tesla (1.5 T) field strength. It is to be appreciated that alternative TRs would be selected for other field strengths, in which the TRs would be scaled inversely for other fields. Referring further to FIG. 3, the longitudinal magnetization 300 is shown which is substantially the same as longitudinal magnetization 200 of FIG. 2. Further, the transverse magnetization 310 is shown in FIG. 3 when employing a SSFP pulse sequence with two TRs. The phase of the RF pulse alternates between 0 and $\pi$ in this exemplary embodiment shown in FIG. 3. As shown, the average signal around the null point is roughly one sixth the signal at 0 Hz. The null region has been broadened from around 60 Hz to roughly 200 Hz. Thus, separation of lipids from water has been enhanced by employing the above-described SSFP pulse sequence.

The breadth of the null region and central plateau can be further tuned by a variety of techniques. For instance, in an exemplary embodiment, when the long TR of the double-TR sequence is modulated up and down by about 1%, for example, between 3.95 ms and 4.05 ms, then the width of the central plateau is increased somewhat, at the cost of a roughly 8% loss in signal. On the other hand, if the long-TR portion of the pulse sequence is increased to 6 ms then the central plateau shrinks in width and the null region is broadened. Desirably, modulation is selected to achieve a broad null region about the fat resonance in this exemplary embodiment. It is to be appreciated that other lipids will have a different resonance and the two TRs would be selected and modulated in accordance with the different resonance.

Referring further to FIG. 3, the magnetization and phase for the FIESTA pulse sequence of FIG. 2 are shown with TR alternating between 2 ms and 4 ms and with the signal read during the short-TR portion of the pulse sequence. It is to be appreciated that imaging can be performed during the long-TR portion of the pulse sequence as well as the short-TR portion, resulting in an additional image which exhibits different chemical-shift behavior, without any increase in total imaging time. Therefore, in a further embodiment, a method for acquiring images with water and lipid separation also comprises the step of reading a plurality of image signals during a selected portion (short-TR or alternatively, long-TR portions) of the plurality of SSFP pulses.

Furthermore, embodiments for a system for MRI are also provided. The system includes the components of FIG. 1 as described above and further comprises transmitter 102 being adapted to perform according to the methods described herein. An embodiment of a system for Magnetic Resonance Imaging (MRI) for acquiring images of an object comprises a magnetic field driver for driving a field gradient, a magnetic field controller for controlling the magnetic field, a transmitter for generating an radio frequency (RF) pulse to cause resonance and wherein the transmitter is adapted to generate a plurality of steady-state free precession (SSFP) radio-frequency excitation pulses having respective inter-pulse gaps between the pulses to discriminate lipids from water wherein the inter-pulse gaps alternate between a first width and a second width, a receiver for receiving and detecting magnetic resonance signals generated from the object, and, a processor for performing image reconstruction and for generating images for display. Thus, transmitter 102 is desirably adapted to generate and apply during imaging with the MRI system a plurality of steady-state free precession (SSFP) radio-frequency (RF) excitation pulses employing the methods described above to discriminate lipids from water.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for acquiring images with water and lipid separation using a magnetic resonance imaging (MRI) system, the method comprising:

applying a plurality of steady-state free precession (SSFP) radio-frequency (RF) excitation pulses having respective inter-pulse gaps between the pulses to discriminate lipids from water, the plurality of pulses alternating between a first repetition time and a second repetition time greater than the first repetition time to obtain the inter-pulse gaps that vary among different widths and wherein the second repetition time is modulated up and down to achieve a broad null region about fat resonance to attenuate signals attributed to the lipids.

2. The method of claim 1 wherein the pulses are applied repeatedly during imaging to produce respective images corresponding to lipids and water.

3. The method of claim 1 wherein the first repetition time is substantially 2 ms and the second repetition time is substantially 4 ms and the MRI system has a 1.5 Tesla (1.5 T) field strength.

4. The method of claim 3 wherein the second repetition time is modulated up and down by about 1%.

5. The method of claim 1 further comprising the step of reading a plurality of image signals during a selected portion of the plurality of pulses.

6. The method of claim 1 wherein the pulses are substantially constant in amplitude.

7. A system for Magnetic Resonance Imaging (MRI) for acquiring images of an object comprising:

a magnetic field driver for driving a field gradient;

a magnetic field controller for controlling the magnetic field;

a transmitter for generating an radio frequency (RF) pulse to cause resonance and wherein the transmitter is adapted to generate a plurality of steady-state free precession (SSFP) radio-frequency excitation pulses having respective inter-pulse gaps between the pulses to discriminate lipids from water, the plurality of pulses alternating between a first repetition time and a second repetition time greater than the first repetition time to obtain the inter-pulse gaps that vary among different widths and wherein the second repetition time is modulated up and down to achieve a broad null region about fat resonance to attenuate signals attributed to the lipids;

a receiver for receiving and detecting magnetic resonance signals generated from the object; and, a processor for performing image reconstruction and for generating images for display.

8. The system of claim 7 wherein the second repetition time is modulated up and down by about 1%.

9. The system of claim 8 wherein the first repetition time is substantially 2 ms and the second repetition time is substantially 4 ms and the MRI system has a 1.5 Tesla (1.5 T) field strength.

10. A method for acquiring images with water and lipid separation using a magnetic resonance imaging (MRI) system, the method comprising:

applying a plurality of steady-state free precession (SSFP) radio-frequency (RF) excitation pulses, the plurality of pulses alternating between a first repetition time and a second repetition time greater than the first repetition time to generate respective inter-pulse gaps between the pulses to discriminate lipids from water, the inter-pulse gaps alternating between a first width and a second width and wherein the second repetition time is modulated up and down to achieve a broad null region about fat resonance to attenuate signals attributed to the lipids.

11. The method of claim 10 wherein the first repetition time is substantially 2 ms and the second repetition time is substantially 4 ms and the MRI system has a 1.5 Tesla (1.5 T) field strength.

12. The method of claim 11 wherein the second repetition time is modulated up and down by about 1%.

13. The method of claim 10 further comprising the step of reading a plurality of image signals during a selected portion of the plurality of pulses.

* * * * *